United States Patent
Richardson et al.

(10) Patent No.: US 6,356,532 B1
(45) Date of Patent: *Mar. 12, 2002

(54) COMPUTER NETWORK CROSS-CONNECT PANEL PROVIDING PHYSICAL LAYER MONITORING AND METHOD THEREFOR

(75) Inventors: William M. Richardson, Bolton; Leslie H. Swanson, Cambridge, both of MA (US)

(73) Assignee: Vigilant Networks, LLC, Hampton, NH (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/995,041

(22) Filed: Oct. 28, 1997

Related U.S. Application Data

(60) Provisional application No. 60/029,046, filed on Oct. 29, 1996.

(51) Int. Cl.[7] .............................................. G01R 31/08
(52) U.S. Cl. ...................... 370/248; 370/252; 370/463; 702/79; 709/224
(58) Field of Search ................................. 370/241, 248, 370/254, 256, 351, 352, 463, 466, 358, 257, 252; 702/187, 79; 709/224, 239, 223; 361/796; 324/754; 340/146; 395/200; 379/27, 112, 442

(56) References Cited

U.S. PATENT DOCUMENTS

| | | | | |
|---|---|---|---|---|
| 4,672,529 A | * | 6/1987 | Kupersmit | 700/1 |
| 4,815,104 A | * | 3/1989 | Williams et al. | 375/257 |
| 4,840,568 A | * | 6/1989 | Burroughs et al. | 439/49 |
| 5,078,624 A | * | 1/1992 | Burroughs et al. | 439/668 |
| 5,214,673 A | * | 5/1993 | Morgenstern et al. | 375/257 |
| 5,220,600 A | * | 6/1993 | Chouanard et al. | 379/327 |
| 5,226,120 A | * | 7/1993 | Brown et al. | 709/224 |
| 5,333,183 A | * | 7/1994 | Herbert | 379/112 |
| 5,416,427 A | * | 5/1995 | Tracewell | 324/754 |
| 5,522,046 A | * | 5/1996 | McMillen et al. | 709/239 |
| 5,546,282 A | * | 8/1996 | Hill et al. | 361/796 |
| 5,598,455 A | * | 1/1997 | Bliven et al. | 379/27 |
| 5,682,328 A | * | 10/1997 | Roeber et al. | 702/187 |
| 5,784,377 A | * | 7/1998 | Baydar et al. | 370/463 |
| 5,790,523 A | * | 8/1998 | Ritchie, Jr. et al. | 370/241 |
| 6,016,464 A | * | 1/2000 | Richardson | 702/79 |

FOREIGN PATENT DOCUMENTS

EP 0 768 537 A1 4/1997 ........... G01R/31/11

* cited by examiner

Primary Examiner—Hassan Kizou
Assistant Examiner—John Pezzlo
(74) Attorney, Agent, or Firm—Rader, Fishman & Grauer PLLC

(57) ABSTRACT

A cross-connect panel for a computer network is disclosed that provides a mechanism for connecting to the signal transmission media of the network. In the typical scenario, the inventive cross-connect panel replaces the common cross-connect panel that receives the various cables running between the remote nodes and the hub, switch, or other network communications device. The panel has a series of panel-node connectors that are adapted to receive the signal transmission media from the network nodes. The cross-connect panel also has panel-device connectors that in most embodiments will be of a standard type to connect to the network communications device. The panel-node connectors and the panel-device connectors are electrically interconnected to each other via a backplane to complete the communications links. The panel further includes a monitoring port that is also preferably connected to the backplane to provide physical layer access to the communications links. In this way, a network monitoring device interfacing with the port may be connected directly to the network's communications links or disconnected when monitoring is not necessary.

31 Claims, 5 Drawing Sheets

COMPUTER NETWORK CROSS-CONNECT PANEL PROVIDING PHYSICAL LAYER MONITORING AND METHOD THEREFOR

RELATED APPLICATION

This application claims priority to U.S. Provisional Application No. 60/029,046, filed Oct. 29, 1996, the entire teachings of which are incorporated herein by reference.

BACKGROUND OF THE INVENTION

Computer network performance can be impacted by factors relating to the devices that communicate through the network. Particular network nodes, e.g., computer workstations, may monopolize the network's limited bandwidth by transmitting a large number of packets. This consumption of bandwidth can be caused by the execution of application programs that require the bandwidth, or it can be sometimes caused by malfunctions in these programs. For example, communicating computers commonly issue acknowledge packets to signal the receipt of a packet, and the failure to properly process the acknowledgment will usually cause the sending computer to repeatedly retransmit the original packet. Problems may also arise with network communications devices, e.g., hubs, switches, bridges, and routers, that facilitate the inter-node communications. These devices may malfunction by incorrectly forwarding packets between the separate communications links that the devices maintain. When those scenarios occur chronically, a large portion of the bandwidth can be needlessly wasted.

Different types of performance-impacting problems can arise with the media that is used to transmit the messages between network devices. The shielding in twisted pair and coaxial cables may be damaged, connectors may have oxidized, or devices may improperly electrically interface to the media. Each of these problems can interfere with the electrical signal transmission and lead to transmission errors, which necessitates the retransmission of packets and thus the consumption of bandwidth.

A class of devices has evolved to diagnose problems occurring at the software layer, in the seven layer open systems interconnection (OSI) reference model. Protocol analyzers and remote monitoring (RMon) probes are commercially available devices that decode properly formatted digital transmissions on local area networks (LANs). These devices use standard network interface hardware and function as passive network nodes that acquire packets and detect the cable voltages that are associated with collisions in the example of carrier sense multiple access with collision detection (CSMA/CD) type networks. The origin, destination, and number of packets can be determined by reference to the packets' headers and bandwidth utilization statistics accumulated. The number and frequency of collisions can also be monitored.

Some problems, however, are invisible to the network analyzers and monitors. Transmissions that do not strictly conform with the network's protocol, such as invalid packets exposed through error checking, are simply ignored by these devices. In other instances, these protocol analyzers and RMon probes will not capture successive packet transmissions that do not comply with the protocol for the inter-frame gap, i.e., the minimum time allowed between successive packet transmissions. These devices will chronically miss the second in-time packet.

Time domain reflectometry (TDR) techniques can be used to analyze the network's physical layer. According to the technique, a pulse of a known shape is injected or launched onto the cabling of the network. As this pulse propagates down the cable and hits electrical "obstacles," or changes in the cable's characteristic impedance, echoes are generated that travel back to the point of injection. The existence of the echo can indicate cable breaks, frayed cables, bad taps, loose connections, or poorly matched terminations. The time interval between the initial transmission of the pulse and the receipt of the echo is a function of a distance to the source of the echo. In fact, by carefully timing this interval, the source of the echo can be accurately located. Drawbacks, however, exist in conventional TDR techniques. Generally, they can only be used on non-operational networks. This principally limits TDR to testing networks at the time of installation.

More recently, inventors in the instant application have proposed techniques that solve the shortcomings associated with network analyzers and TDR techniques. This is disclosed in U.S. patent application Ser. No. 08/619,934, filed on Mar. 18, 1996 entitled "Packet Network Monitoring Device". This application is incorporated herein in its entirety by this reference. The approach described in this application provides for the high speed digital sampling of the communications on the network. In this way, it enables analysis of those signals at the physical layer and in terms of the actual current or voltage transitions occurring on the cabling. As a result, improperly formatted or corrupted transmissions may be decoded and analyzed. This distinguishes it from network analyzers that merely decode properly formatted transmissions. Additionally, the approach also provides for a type of TDR analysis on a functioning network and, as disclosed in U.S. patent application Ser. No. 08/890,486, filed on Jul. 9, 1997 entitled "Method and System for Characterizing Terminations in a Local Area Network", which is also incorporated herein in its entirety by this reference, the physical extent of the network is determinable.

SUMMARY OF THE INVENTION

The present invention is directed to a cross-connect panel that provides a mechanism for connecting to the signal transmission media of a computer network. In this way, it is compatible with the systems disclosed in the 08/619,934 and 08/890,486 applications, providing a connection to an operational, installed network to allow the monitoring of the separate communication links forming the network. In the typical scenario, the inventive cross-connect panel replaces the common cross-connect panel that receives the various cables running between the remote nodes and the hub, switch, or other network communications device.

Accordingly, the invention provides a series of panel-node connectors that are adapted to receive the signal transmission media from the network nodes, which may be individual nodes in the case of a star topology network with a hub communications device or separate LANs in different collision domains in the case of a switch, bridge, or router communications device. In a typical implementation, each panel-node connector may be realized as a group of wire-wrap pins around which wires from the remote nodes, or similar devices, are wound. The groups together define punch-down channels into which the cables from the nodes are placed in some implementations.

The cross-connect panel also has panel-device connectors that in most embodiments will be of a standard type, RJ-45 in one very specific implementation. The panel-device connectors are intended to link the network communications device to the panel.

The panel-node connectors and the panel-device connectors are electrically interconnected to each other via a backplane to complete the communications links. The backplane could in many specific embodiments be a circuit board or other interconnect that provides separate conductor paths between the connectors. What distinguishes the inventive cross-connect panel, however, is the fact that the panel further includes a monitoring port that is also preferably connected to the backplane to provide physical layer access to the communications links. In this way, a network monitoring device interfacing with the port is connected directly to the network's communications links or disconnected when monitoring is not necessary.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PRESENT INVENTION

Figure 1:
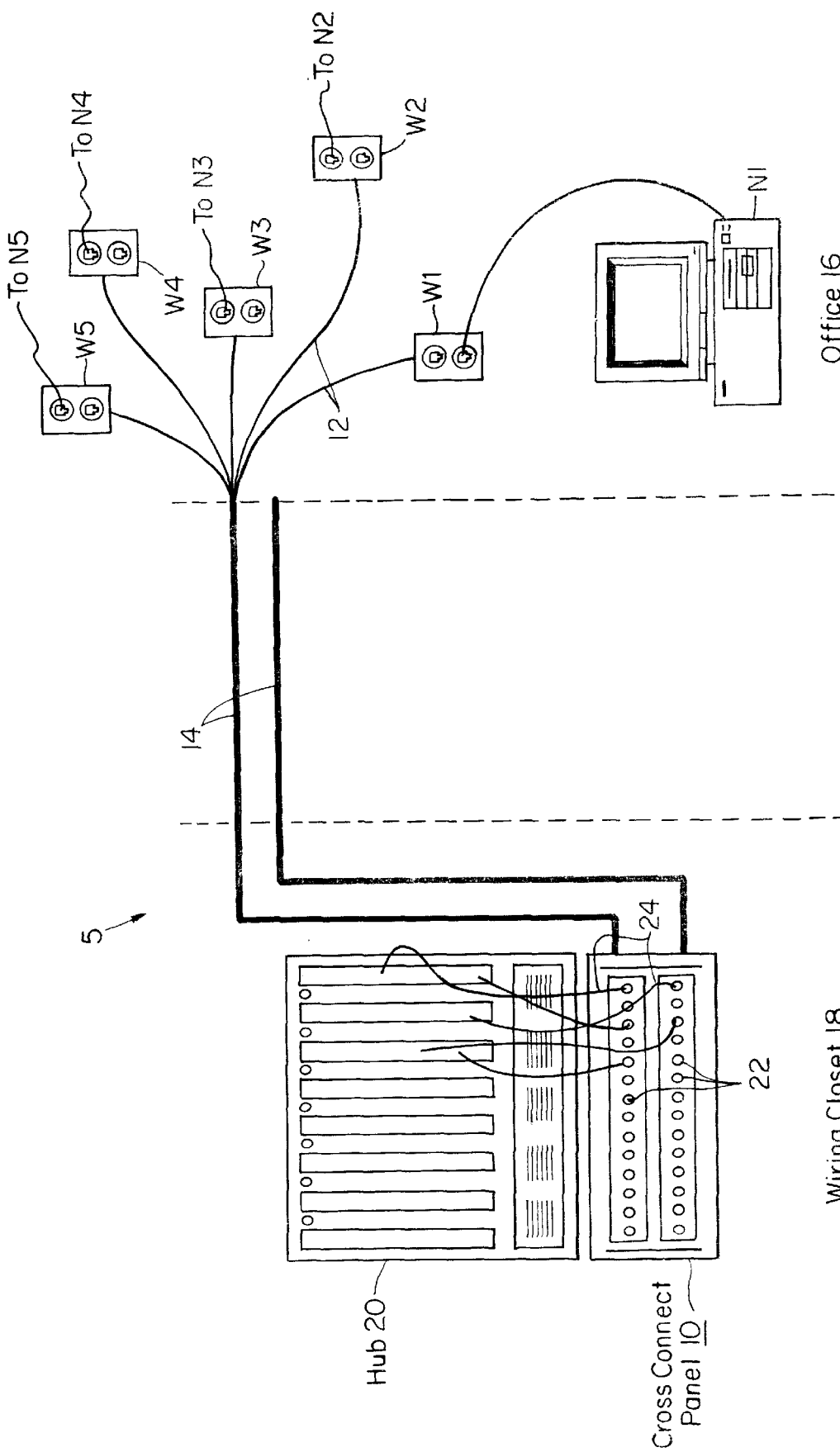
FIG. 1 is a schematic diagram showing the typical role of a cross-connect panel in a local area network.

FIG. 1 shows a typical cross-connect panel 10 in a computer network 5. A network communications device 20, such as a hub, switch, bridge, or router, is connected to a number of remote network nodes N1–N5. In the common example, these network nodes are computer workstations such as IBM-compatible computers. Each remote network node N1–N5 is connected to a wall panel W1–W5, commonly located in the office or cubicle 16 in which the computer is located. These wall panels receive, in one implementation, four twisted pair wires supporting a communications link in a common jack or connector scheme. The wires 12 from the wall panels W1–W5 are bundled into larger horizontal cables 14 of 24 to 48 separate groups of four twisted-pair wires from other nodes in other offices.

Each of the horizontal cables 14 terminates usually in a wiring closet 18 housing the cross-connect panel 10 and the network communications device 20. Each group of wires of a communications link is associated with and electrically connected to a separate panel-device connector 22 on the front of the cross-connect panel 10. Short jumper cables or patch cords 24 are used between each panel-device connector 22 of the cross-connect panel 10 and the communications device 20.

Generally, cross-connect panels provide a convenient way to terminate the horizontal cables 14 while allowing computers to be connected to different ports of the network communication device. Moreover, the communications device 20 may be replaced simply by switching the patch cords 24.

Figure 2A:
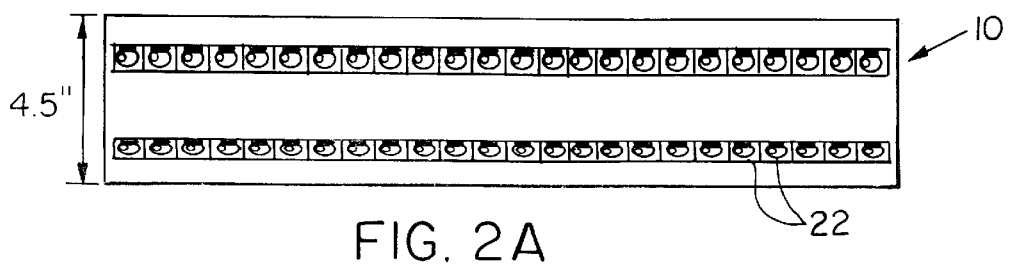
FIGS. 2A and 2B are front and rear views, respectively, of the typical cross-connect panel.
Figure 2B:
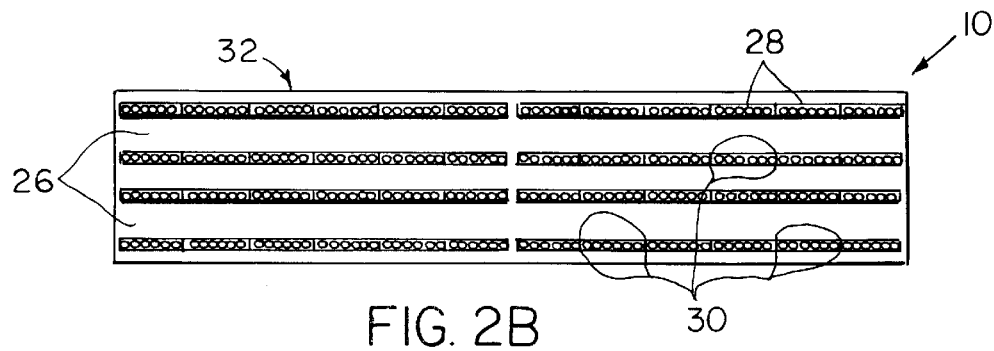

FIGS. 2A and 2B are front and rear views, respectively, of the typical cross-connect panel 10. The front of the cross-connect panel has a plurality, 48 in the illustrated example, of the panel-device connectors 22. These could be RJ-45 connectors, in one implementation, which are common in 10Base(T) networks. If the communication device is a switch and each panel-device connector connects to a separate network in its own collision domain, then connectors 22 could be the coaxial connectors found in 10Base(2), (5) networks, for example.

The rear of the panel 10, shown in FIG. 2B, has two punchdown channels 26. Each of these channels 26 is defined by two rows of wire-wrap pins 28 that extend horizontally across the panel. The horizontal cables are placed in these punchdown channels, and the wires that represent a communications link are individually wrapped onto the pins in the same pin group 30. These pin groups 30 represent panel-node connectors and are connected electrically to the associated panel-device connector 22 on the other side of the panel 10 via a backplane 32. The punchdown channels 26, pins 28, and the connectors 22 are supported on the backplane. Typically, backplane comprises a circuitboard-like structure that has the embedded conductor paths that interconnect the wire-wrap pins 28 of panel-node connectors 30 to the associated panel-device connectors 22.

Figure 3:
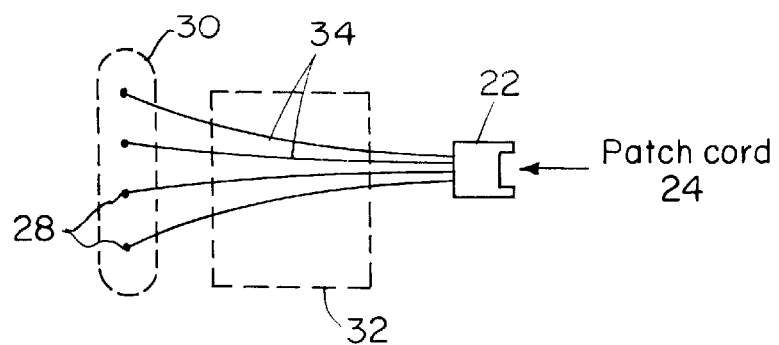
FIG. 3 is a circuit diagram showing the interconnection between panel-node connectors and panel-device connectors of the panel.

FIG. 3 is a simple circuit diagram illustrating the connection between a pin group 30 and a panel-device connector 22. Each pin group has a number of wire-wrap pins 28. The pins of the group 30 are connected via conductor paths 34 in the backplane 32 to the associated connector 22.

Figure 4:
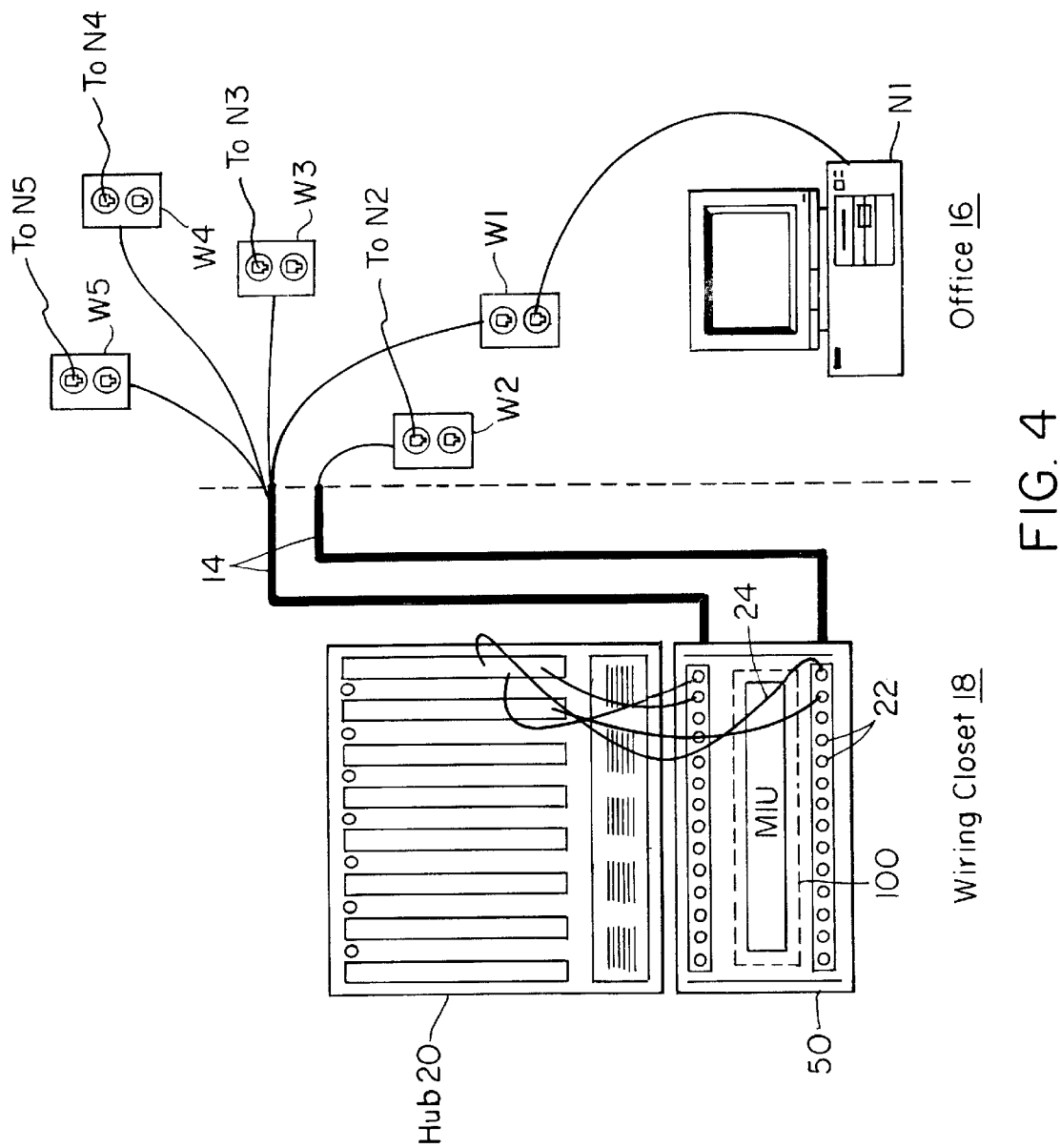
FIG. 4 is a schematic diagram showing the cross-connect panel according to the present invention.

FIG. 4 shows a cross-connect panel 50 that has been constructed according to the principles of the present invention. Similar to the typical panel 10, the illustrated embodiment receives the horizontal cables 14. Patch cords 24 are used between the network communications device 20 and the panel-device connectors 22 of the panel 50 to complete the separate communications links from the nodes N1–N5.

The panel 50, however, differs in that it includes a monitoring port to which a media interface unit (MIU) 100 is connected. The port provide physical layer access to the communications links by supporting direct signal taps to the communications media of the links.

Figure 5A:
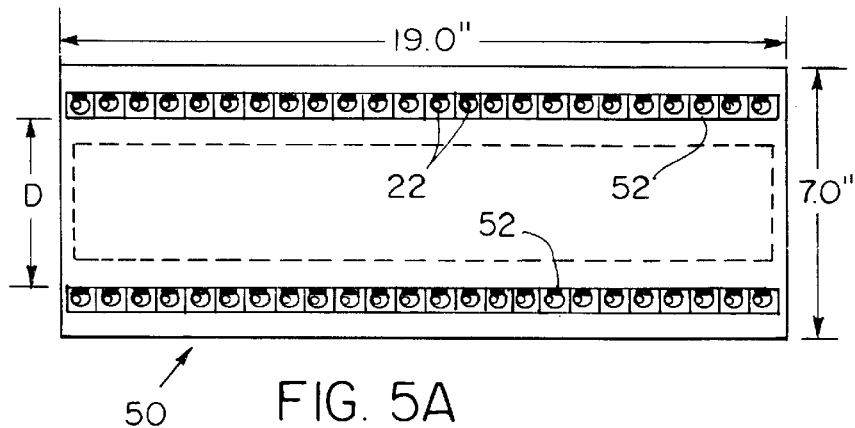
FIGS. 5A and 5B are front and rear views, respectively, of a cross-connect panel of the present invention.
Figure 5B:
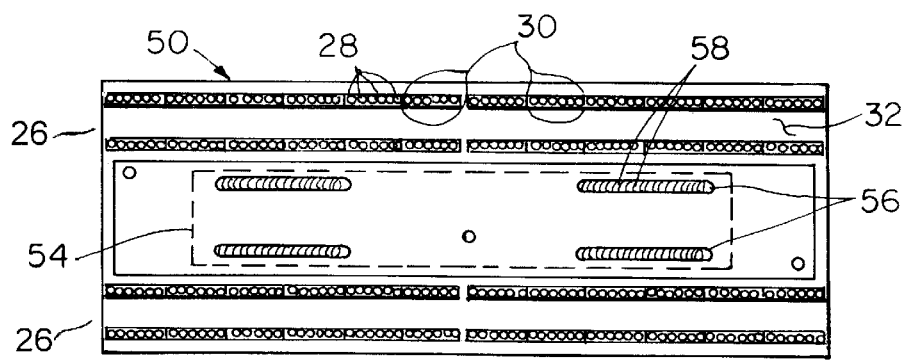

FIGS. 5A and 5B show front and rear views, respectively, of the inventive a cross-connect panel. The front of the panel has rows 52 of panel-device connectors 22. The distance D between these rows are usually somewhat larger than is typical to accommodate the monitoring port 54 on the rear of the panel.

The monitoring port 54 is implemented as four male connectors 56 in one embodiment. Each pin 58 of these connectors 56 is connected to a separate conductor path through the backplane 32 between a pin 28 and its associated panel-device connector 22. In this way, there is a connection to the physical layer of the communications links that pass through the panel 50.

In other embodiments, the connectors 56 are located in widened punchdown channels 26, between the rows of wire-wrap pins 28. This configuration has the advantage of reducing parasitic capacitance and crosstalk by reducing signal path lengths of the taps.

Figure 6:
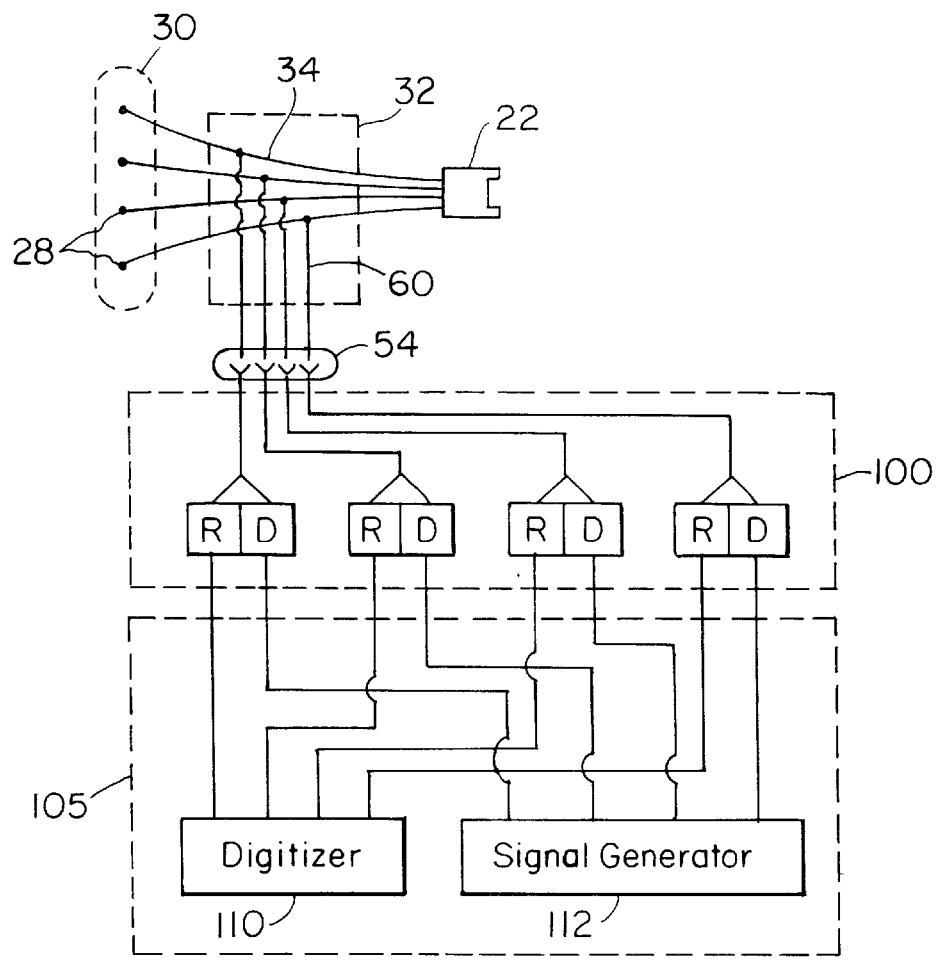
FIG. 6 is a circuit diagram showing the MIU and the signal taps to the communications links of the panel.

FIG. 6 is a circuit diagram showing the connections between the panel-device connector 22, the panel-node connector 30, and the monitoring port 54. Signal taps 60 are preferably formed in the backplane 32 to the four conductor paths 34 that link the wire-wrap pins 28 to the panel-device connector 22. These signal taps 60 enable the monitoring of the communications links by the MIU 100 via the port 54.

To minimize the effects of the connections to the links, the signal taps 60 preferably match the characteristic impedance of the links. This impedance is 100 Ohms in many common networks, for example.

As more completely discussed in the 08/619,934 application, the MIU 100 has pairs of receivers R and drivers D connected to the taps 60 with a high input impedance. The receivers R detect voltages on the wires of the communications links to enable the digital sampling of those voltages by a digitizer 110 of a LAN pod 105 and thus the physical level analysis of the communications on the links. The drivers D enable generation of diagnostic signals from a signal generator 112 of the LAN pod 105 on the wires to perform a type of time domain reflectometry analysis, for example.

Figure 7:
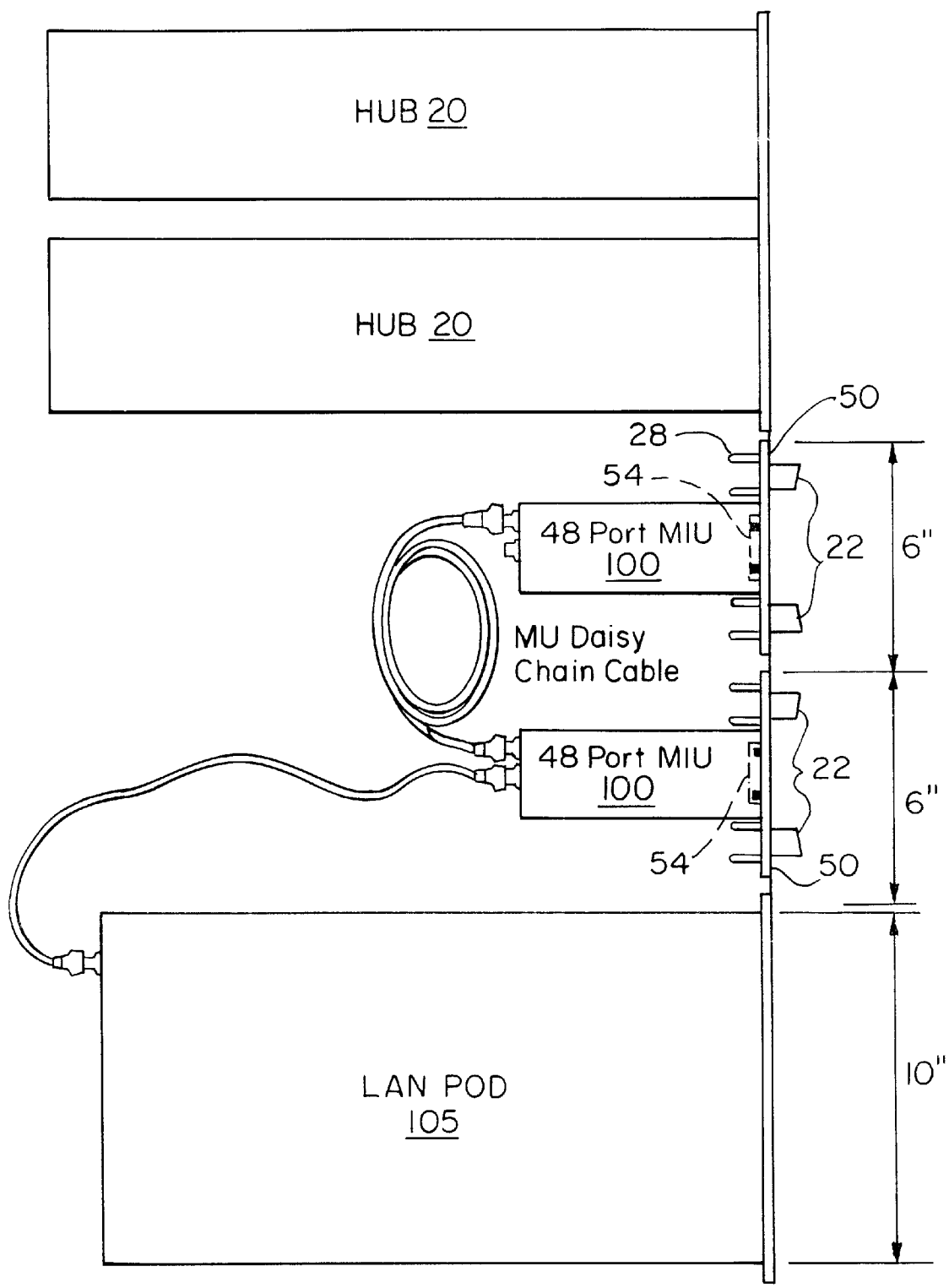
FIG. 7 is a side plan view of the multiple cross-connect panels and MIU's for monitoring hubs of a LAN stack.

FIG. 7 is a side plan view of the cross-connect panels 50, hubs 20, MIU's 100, and a LAN pod 105 in a network stack. As illustrated, the separate MIU's 100 may be daisy-chained so that a single pod 105 can monitor communications from different hubs in the same stack.

While this invention has been particularly shown and described with references to preferred embodiments thereof, it will be understood by those skilled in the art that various changes in form and details may be made therein without departing from the spirit and scope of the invention as defined by the appended claims.

We claim:

1. A computer network cross-connect panel for providing physical layer monitoring of communications links between a network communication device and remote network nodes, the panel comprising:

a backplane;

panel-node connectors, attached to the backplane, which are adapted to receive signal transmission media from remote network nodes;

panel-device connectors, attached to the backplane, which are adapted to receive signal transmission media from the network communication device, each one of the panel-device connectors being connected to a corresponding one of the panel-node connectors to support one of the communications links between the network communication device and the remote network nodes; and a monitoring port, attached to the backplane, which provides physical layer access to the communications links via the backplane, to permit generating and sampling of signals on at least one of the communications links to analyze at least one characteristic of the communications links on an operating network.

2. The cross-connect panel described in claim 1, wherein the network communication device is a hub.

3. The cross-connect panel described in claim 1, wherein the network communication device is a switch or bridge.

4. The cross-connect panel described in claim 1, wherein the panel-device connectors receive patch cords that connect to the network communication device.

5. The cross-connect panel described in claim 1, wherein the panel-device connectors support connections to a plurality of conductors.

6. The cross-connect panel described in claim 1, wherein the panel-node connectors are arrayed in at least one punchdown channel on the backplane.

7. The cross-connect panel described in claim 1, wherein the panel-node connectors each comprise a plurality of wire-wrap pins.

8. The cross-connect panel described in claim 1, wherein the backplane comprises a substrate supporting conductors that electrically connect the panel-node connectors and panel-device connectors.

9. The cross-connect panel described in claim 1, wherein the monitoring port provides taps to every one of the communications links supported by the panel.

10. The cross-connect panel described in claim 1, wherein the monitoring port is adapted to receive a media interface unit.

11. The cross-connect panel described in claim 10, wherein media interface unit simultaneously connects to tap each one of the communications links.

12. The cross-connect panel described in claim 11, further comprising a digitizer for digitally sampling signals on the communications links via the media interface unit.

13. A method for monitoring communications links in a computer network including a cross-connect panel that interconnects network devices, the method comprising:

providing a monitoring port on the cross-connect panel;

linking the monitoring port to each of said communications links at a physical layer corresponding to the communications media of the communications links; and selectively analyzing at least one characteristic of at least one of the communications links via the monitoring port, by generating and sampling signals on the communications links on an operating network.

14. The method described in claim 13, wherein the network devices include a hub.

15. The method described in claim 13, wherein the network devices include a switch or bridge.

16. The method described in claim 13, further comprising connecting the panel to a network communication device via patch cords that connect to panel-device connectors of the panel.

17. The method described in claim 15, further comprising connecting the panel to nodes via panel-node connectors.

18. The method described in claim 16, further comprising interconnecting the panel-node connectors and the panel-device connectors via a backplane.

19. The method described in claim 16, further comprising connecting the monitoring port to conductor paths between panel-node connectors and the panel-device connectors.

20. The method described in claim 13, further comprising connecting a digitizer to the monitoring port to digitally sample communications on the communications media of the communications links.

21. The method described in claim 13, further comprising connecting a function generator to the monitoring port that performs said generating of said signals.

22. A computer network cross-connect panel for providing physical layer monitoring of communications links between a network communication device and remote network nodes, the panel comprising:

a backplane;

wire connectors, attached to the backplane and arrayed in at least one punchdown channel, which are adapted to receive wire signal transmission media from remote network nodes;

panel device RJ-45 connectors, attached to the backplane, which are adapted to receive signal transmission media from the network communication device, each one of the panel device connectors being connected to corresponding wire connectors to support one of the communications links between the network communication device and the remote network nodes; and a monitoring port, attached to the backplane, which provides physical layer access for a media interface unit to the communications links via the backplane, to permit generating and sampling of signals on at least one of the communications links to analyze at least one characteristic of the communications links on an operating network.

23. The cross-connect panel described in claim 21, further comprising a digitizer that performs said sampling of said signals.

24. A method for monitoring communications links in a computer network including a cross-connect panel that interconnects network devices, the method comprising:

providing a monitoring port on the cross-connect panel providing signal taps to a physical layer of communications media of the communications links;

generating on the communications links via the monitoring port a signal with a function generator;

sampling the signal on the communications links via the monitoring port with a digitizer; and analyzing the signal to evaluate at least one characteristic of the communications links.

25. The method described in claim 22, further comprising performing time domain reflectometry on the links via the monitoring port.

26. The cross-connect panel described in claim 9, wherein the monitoring port is physically connected to a predetermined pin group.

27. The cross-connect panel described in claim 25, wherein the taps extend from each of a plurality of wire wrap pins comprising the pin group to a corresponding connector path of the monitoring port.

28. The cross-connect panel as described in claim 26, wherein at least one of a receiver and driver is connected to the monitoring port.

29. The cross-connect panel as described in claim 9, wherein the taps match the characteristic impedance of the links.

30. A cross connect panel described in claim 1, wherein said generating and sampling of signals to analyze at least one characteristic of at least one communication link occurs simultaneously on all communications links.

31. The cross-connect panel described in claim 21, wherein said generating and sampling of signals to analyze at least one characteristic of at least one communication link occurs simultaneously on all communications links.

* * * * *